(12) United States Patent
Shea

(10) Patent No.: US 12,191,100 B2
(45) Date of Patent: Jan. 7, 2025

(54) ARC FLASH DETECTION METHOD

(71) Applicant: Schneider Electric USA, Inc., Andover, MA (US)

(72) Inventor: John J. Shea, Wake Forest, NC (US)

(73) Assignee: Schneider Electric USA, Inc., Boston, MA (US)

( * ) Notice: Subject to any disclaimer, the term of this patent is extended or adjusted under 35 U.S.C. 154(b) by 376 days.

(21) Appl. No.: 17/559,769

(22) Filed: Dec. 22, 2021

(65) Prior Publication Data

US 2023/0197391 A1  Jun. 22, 2023

(51) Int. Cl.
*H01H 83/20* (2006.01)
*G01R 31/52* (2020.01)
*H02H 1/00* (2006.01)

(52) U.S. Cl.
CPC ............. *H01H 83/20* (2013.01); *G01R 31/52* (2020.01); *H02H 1/0015* (2013.01); *H01H 2083/201* (2013.01)

(58) Field of Classification Search
CPC .. H01H 83/20; H01H 2083/201; G01R 31/52; G01R 31/1227; G01R 31/3272; H02H 1/0015; H02H 3/202; H02H 3/445; H02H 3/20; H02H 1/0023; H02H 3/087; H02H 3/10
See application file for complete search history.

(56) References Cited

U.S. PATENT DOCUMENTS

| | | | |
|---|---|---|---|
| 11,024,474 B1* | 6/2021 | Sastry | H02H 1/0061 |
| 2008/0106832 A1 | 5/2008 | Restrepo et al. | |
| 2009/0198459 A1* | 8/2009 | Bilac | H02H 3/33 702/58 |
| 2010/0236909 A1 | 9/2010 | Biedrzycki et al. | |
| 2014/0055886 A1* | 2/2014 | Spangenberg | H02H 7/222 361/2 |
| 2014/0062222 A1 | 3/2014 | Valdes et al. | |
| 2016/0241017 A1 | 8/2016 | Schroeder et al. | |
| 2018/0003730 A1* | 1/2018 | Watanabe | A61J 1/14 |
| 2020/0362729 A1* | 11/2020 | Yokoshima | F16K 31/1221 |
| 2021/0184449 A1 | 6/2021 | Raisigel | |
| 2021/0278453 A1* | 9/2021 | Denney | G01R 31/1227 |

OTHER PUBLICATIONS

International Search Report and Written Opinion dated Apr. 7, 2023 for corresponding International Application No. PCT/US 22/53468, 20 pages.

* cited by examiner

*Primary Examiner* — Jermele M Hollington
*Assistant Examiner* — Zannatul Ferdous
(74) *Attorney, Agent, or Firm* — Locke Lord LLP

(57) ABSTRACT

A method and system are provided to control circuit breaker operations. In the method and system, near-field RF signal is monitored at or around electrical contacts of the circuit breaker using at least one near-field radio frequency (RF) sensor, and far-field RF signal away from the contacts of the circuit breaker are monitored using at least one far-field RF sensor. A rate of change of current over time is also monitored on the circuit using at least one sensor. An arc fault on the circuit is detected based on the monitored near-field RF signal, the monitored far-field RF signal, and the monitored rate of change of current. A tripping operation is implemented on the circuit breaker to disconnect the power supply from the circuit, in response to the detection of the arc fault.

19 Claims, 10 Drawing Sheets

ARC FLASH DETECTION METHOD

TECHNICAL FIELD

The present disclosure relates to fault detection on a power distribution circuit, and more particularly, methods and systems to detect arc flash fault for use with circuit protective devices.

BACKGROUND

Power distribution systems often employ circuit protective devices, such as circuit breakers. Circuit breakers may incorporate a manual Energy Reduction Maintenance System (ERMS) function or Arcflash Reduction Maintenance System (ARMS) function to minimize the time between fault and trip, which can help to reduce the risk of injury when qualified electrical personnel are near energized equipment, such as to perform maintenance or repair work. For example, the ERMS and ARMS functions can reduce protection settings in a maintenance mode so that a circuit breaker may trip more quickly when an arc fault occurs. However, existing breakers with ERMS and ARMS functionality require manual operation of a switch or knob to turn ON the maintenance mode, and to turn OFF this maintenance functionality to return to a normal operational mode in order to avoid potential nuisance tripping.

SUMMARY

In accordance with an embodiment, a method and system are provided to control operations of a circuit breaker for connecting or disconnecting a power supply to or from a circuit respectively. The method and system involve: monitoring, using at least one near-field radio frequency (RF) sensor, near-field RF signal at or around electrical contacts of the circuit breaker; monitoring, using at least one far-field RF sensor, far-field RF signal away from the contacts of the circuit breaker; monitoring, using at least one sensor, a rate of change of current over time on the circuit; detecting an arc fault on the circuit based on the monitored near-field RF signal, the monitored far-field RF signal, and the monitored rate of change of current; and implementing a tripping operation on the circuit breaker to disconnect the power supply from the circuit, in response to the detection of the arc fault.

In various embodiments, the at least one near-field sensor can include a near-field RF sensor for each pole of the circuit breaker which comprises a multi-pole circuit breaker or a circuit breaker for a multi-phase power supply.

In various embodiments, in the method and system, a tripping operation can be initiated in response to (1) detection of high initial RF signal pulse and a sustained low level RF signal via the far-field RF sensor, (2) no detection of an RF signal via the near-field RF sensor, and (3) detection of the rate of change of current over time satisfying or exceeding a trip threshold.

In various embodiments, the circuit breaker can be an upstream circuit breaker, and the circuit can include at least one branch circuit having a branch circuit breaker which is downstream from the upstream circuit breaker. The method and system can further involve: receiving information that the at least one branch circuit breaker is tripping or switching; and inhibiting the tripping operation of the upstream circuit breaker in response to the received information. For example, the inhibit function can be used to signal to an upstream breaker that the downstream breaker is in the process of switching (tripping), either from a fault (non-internal arcing fault) or simply an opening operation under steady-state current. This opening action could generate an RF signal on the far-field coil that could falsely be interpreted as an internal arcing fault.

In various embodiments, the circuit breaker can be an upstream or feeder circuit breaker, and the circuit can include a plurality of branch circuits each of which has a branch circuit breaker which is downstream from the upstream or feeder circuit breaker. The method and system can further involve: receiving information that one or more of the plurality of branch circuit breakers are tripping or switching; and inhibiting the tripping operation of the upstream or feeder circuit breaker in response to the received information. For example, the inhibit function can be used to signal to a feeder breaker that another breaker is in the process of switching (tripping), either from a fault (non-internal arcing fault) or simply an opening operation under steady-state current. This opening action could generate an RF signal on the far-field coil that could falsely be interpreted as an internal arcing fault.

In various embodiments, the near-field and far-field RF sensors can be tuned for a frequency range comprising at or around 10 to 30 MHz bandwidth. The monitored near-field and far-field RF signals can be used to monitor electrical conditions on the circuit within a switchgear enclosure. For example, the near-field sensor can be designed to only respond to magnetic fields, inductively coupled between the near-field coil and the circuit breaker conductors, especially near the contacts. The far-field sensor can be designed to measure RF radiation from sources at longer distances as compared to the near-field sensor. The rate of decay can be radiation for the far-field is inverse-distance squared whereas the near-field drops off at the inverse-distance cubed. Thus, the far-field can be sensitive to all RF signals in a switchgear whereas the near-field sensor can be, for example, sensitive only to the RF signals in close proximity to the circuit breaker conductors and especially the contacts when the sensors are placed near the contacts.

In various embodiments, the tripping operation, which comprises a fast trip operation of the circuit breaker, can be implemented by directly tripping a breaker mechanism of the circuit breaker, via a fast trip solenoid, in response to detection of the arc fault. Furthermore, the method and system can further involve: receiving an inhibit signal from at least one downstream or nearby circuit breaker indicating that the downstream circuit breaker is tripping or switching; and inhibiting the fast trip operation of the circuit breaker while enabling the circuit breaker to operate in a normal trip operation mode according to at least one predefined trip curve.

BRIEF DESCRIPTION OF THE DRAWINGS

A more detailed description of the disclosure, briefly summarized above, may be had by reference to various embodiments, some of which are illustrated in the appended drawings. While the appended drawings illustrate select embodiments of this disclosure, these drawings are not to be considered limiting of its scope, for the disclosure may admit to other equally effective embodiments.

Identical reference numerals have been used, where possible, to designate identical elements that are common to the figures. However, elements disclosed in one embodiment may be beneficially utilized on other embodiments without specific recitation.

DETAILED DESCRIPTION

The present disclosure is directed to systems and methods for detecting an arc fault (also referred to as "arc flash fault") on a circuit. The systems and methods can employ radio frequency (RF) sensors (e.g., RF sensing coils or RF coils) to implement an automatic fast trip operation mode. The RF sensors can be installed or embedded inside a circuit breaker and used to quickly detect any presence of internal arcing faults. Once an arc fault is detected, a solenoid can be triggered to quickly trip the breaker mechanism of the circuit breaker, thereby greatly reducing the potential incident energy produced from the arc flash.

The systems and methods of the present disclosure can provide an automatic fast trip operation mode for a circuit breaker, with no bolted fault, no nuisance trip, and no external fragile wiring and having enough protection (e.g., <4.0 cal/cm$^2$) even under open door situations while maintaining present selectivity and coordination that requires minimal personal protective equipment or PPE (e.g., Cat 1). The systems and method can always be active without the need for manual intervention as in existing systems (e.g., no need for manual adjust of an ERMS or ARMS knob/switch). Furthermore, a direct connection to a fast trip solenoid can further reduce clearing time to limit incident energy to <2.5 cal/cm$^2$.

In the systems and methods, a circuit breaker can be configured to open faster than normal instantaneous trip provided by a conventional electronic trip unit (with a preset trip curve) because of direct triggering. In various embodiments, there is no need to pass through conventional trip unit electronics and slow shunt trip. The circuit breaker also can be configured to automatically inhibit automatic fast trip operation mode under certain conditions. Under such conditions, the circuit breaker can be configured to implement or maintain normal fault detection and trip operation according to preset trip curve(s).

These and other features of the present disclosure will be described in further detail below with reference to the example figures.

Figure 1:
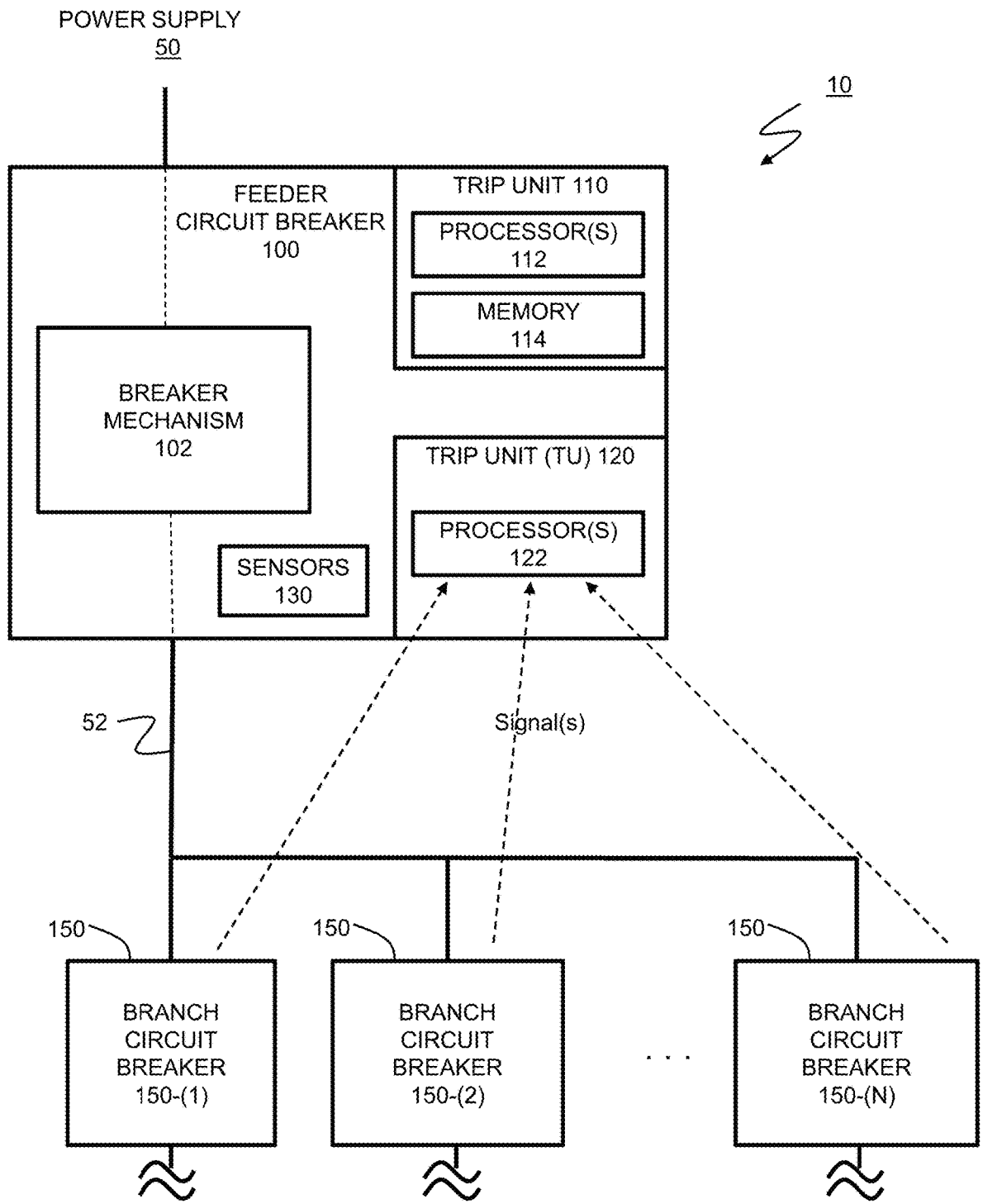
FIG. 1 is an example block diagram of a power distribution system with circuit protective device(s), such as circuit breakers, that employ radio frequency (RF) sensors to implement a fast trip operation mode for detecting an arc fault and other conditions on a circuit to be protected, in accordance with an embodiment.

FIG. 1 is a block diagram of circuit protective device(s), such as circuit breakers, for protecting a circuit against an arc fault and other conditions on the circuit, in accordance with an embodiment. As shown in FIG. 1, a power distribution system 10 includes a power supply 50, which supplies electrical power to a circuit 52 which includes a plurality of branch circuits. The power supply 50 can be a multi-phase power supply (e.g., a three-phase power supply). A circuit breaker 100 is provided upstream on the circuit 52. A plurality of branch circuit breakers 150(1) to 150(N), generally referred to as 150 are provided downstream on the circuit 52, where N is the number of branch circuits. The circuit breakers may be housed in one or more electrical enclosures, such as a switchgear cabinet(s), in a facility or other location.

In accordance with an embodiment, the circuit breaker 100 is configured to implement at least an automatic fast trip operation mode, and normal trip operation mode (e.g., according to preset trip curve(s)). In the fast trip operation mode, the circuit breaker 100 employs RF technology, such as a plurality of RF sensors installed on the breaker, to monitor electrical conditions at or around the electrical contacts of the circuit breaker 100 and to monitor electrical conditions away from the electrical contacts (e.g., to monitor downstream or nearby circuit conditions). In this way, it is possible to quickly differentiate an arc fault event from other non-tripping events on the circuit, which in turn, can enable a tripping operation to be implemented more quickly, thereby reducing clearance times to limit the fault power and the effect of arcing faults. The non-tripping events may include closing of breaker contacts, tripping or other operation at a downstream or nearby circuit breaker or electrical equipment, and so forth.

In various embodiments, the circuit breaker 100 can be a feeder circuit breaker, and may be housed in the same switchgear enclosure as one or more branch circuit breakers 150. The circuit breaker 100 also can be an air circuit breaker (ACB).

As shown in FIG. 1, in this example, the circuit breaker 100 can include a breaker mechanism 102, a plurality of trip units such as trip units 110 and 120, and a plurality of sensors 130 which can be installed or embedded on the circuit breaker 100 or components thereof. The breaker mechanism 102 is configured to electrically and/or physically connect or disconnect the circuit 52 to or from the power supply 50 (or its lines/buses) respectively. The trip units 110 and 120 are configured to perform fault detection using information sensed by the sensors 130, and in the event of a detected fault, to initiate a tripping operation which causes the breaker mechanism 102 to disconnect the circuit 52 from the power supply 50.

The sensors 130 can include radio frequency (RF) sensors configured to detect RF signal(s) at or around the electrical contacts of the circuit breaker, and to detect RF signal(s) away from the circuit breaker and its contacts. For example, the RF sensors can include at least one near-field RF sensor(s) installed near or proximate the breaker contacts, and at least one far-field RF sensor(s) installed away from the breaker contacts. The RF signals can be used to monitor electrical activity and conditions at or around the circuit breaker contacts, and away from the breaker or its contacts (e.g., electrical activity or condition of a downstream or nearby branch circuit breaker or other downstream or nearby electrical equipment (or devices)). In various embodiments, the RF sensors can be tuned to pick up RF signals in the range of 10-30 MHz bandwidth. The RF sensors can be an RF coil, and a near-field RF sensor can be provided for each pole or phase of the circuit breaker 100.

The sensors 130 also can include a current sensor, which can be used to sense the current on the circuit 52 and to sense the rate of change of the current over time (di/dt). The current sensor can be a current transformer (CT) or Rogowski coil, and can be provided for each pole or phase of the circuit breaker. The sensors 130 also can include a voltage sensor for sensing voltage on the circuit 52, or other types of sensors for use in detection of faults (including overload) on an electrical circuit.

The trip unit 110 can be an electronic trip unit, which is configured to implement normal trip operation mode, e.g., normal detection and tripping operations according to preset trip curve(s). The normal trip operation mode may include those for overload protection (long-time delay), neutral conductor protection, short-circuit protection (instantaneous), short-circuit protection (delayed), ground-fault protection, and so forth. The trip unit 110 can include a processor(s) 112 for controlling or implementing operations associated with fault detection and tripping operation, and memory 114 for storing data for use by the processor 112 to perform such operations. The data can include detection and tripping parameters. In various embodiments, the trip unit 110 can be configured to a detect fault condition on the circuit based on current and/or voltage conditions sensed by a current and/or voltage sensor or other sensors.

The trip unit 120 can be an electronic trip unit, which is configured to implement the fast trip operation mode using RF sensors and a current sensor from the sensors 130. In various embodiments, the trip unit 120 can be configured to detect an arc fault when (1) the far-field sensor detects a high initial RF pulse (or burst) and sustained low level RF signal(s) in the far-field, (2) the near-field RF sensor(s) is not detecting RF signal(s) in the near-field, and (3) the rate of change of the current over time (di/dt) satisfies or exceeds a trip threshold, e.g., a sharp rise in the current. In response to arc fault detection, the trip unit 120 is configured to cause the breaker mechanism 102 to disconnect the power supply 50 from the circuit 52. In various embodiments, the trip unit 120 can directly trigger the tripping operation of the breaker mechanism 102, via a fast trip solenoid.

The trip unit 120 can include a processor(s) 122 for controlling or implementing operations associated with fault detection and tripping operation, and may also include memory for storing data for use by the processor 122 to perform such operations. It should be understood that a "processor" as discussed herein may be a microprocessor, a processor, controller, an application specific integrated circuit (ASIC), a programmable logic controller (PLC), a programmable logic device (PLD), a field programmable logic device (FPLD), a field programmable gate array (FPGA), discrete logic, etc. or any other similar device.

Furthermore, the trip unit 120 can be configured to inhibit the fast trip operation mode under certain predefined conditions. For example, in an embodiment, the trip unit 120 can receive information, such as a signal, on whether a downstream or nearby circuit breaker(s) has tripped (e.g., is tripping or switching) or has performed some electrical-related activity. This information can be received via a communication interface or device (not shown) of the circuit breaker 100, for example, via wireline communication or transmission. In response to one or more downstream or nearby circuit breakers (e.g., branch circuit breakers) performing an electrical-related activity such as tripping, the trip unit 120 can be configured to inhibit the fast trip operation mode. In such a case, when the fast trip operation mode is inhibited, the circuit breaker 100 can still implement or maintain the normal trip operation mode via the trip unit 110.

Although the fast trip operation mode is shown as being performed by a separate trip unit, the fast and normal trip operation modes may be performed under control of a single trip unit or device. Furthermore, the tripping units of the circuit breaker 100 may employ the same or different trip triggering circuitry for triggering the tripping operation of the breaker mechanism 102.

Figure 2:
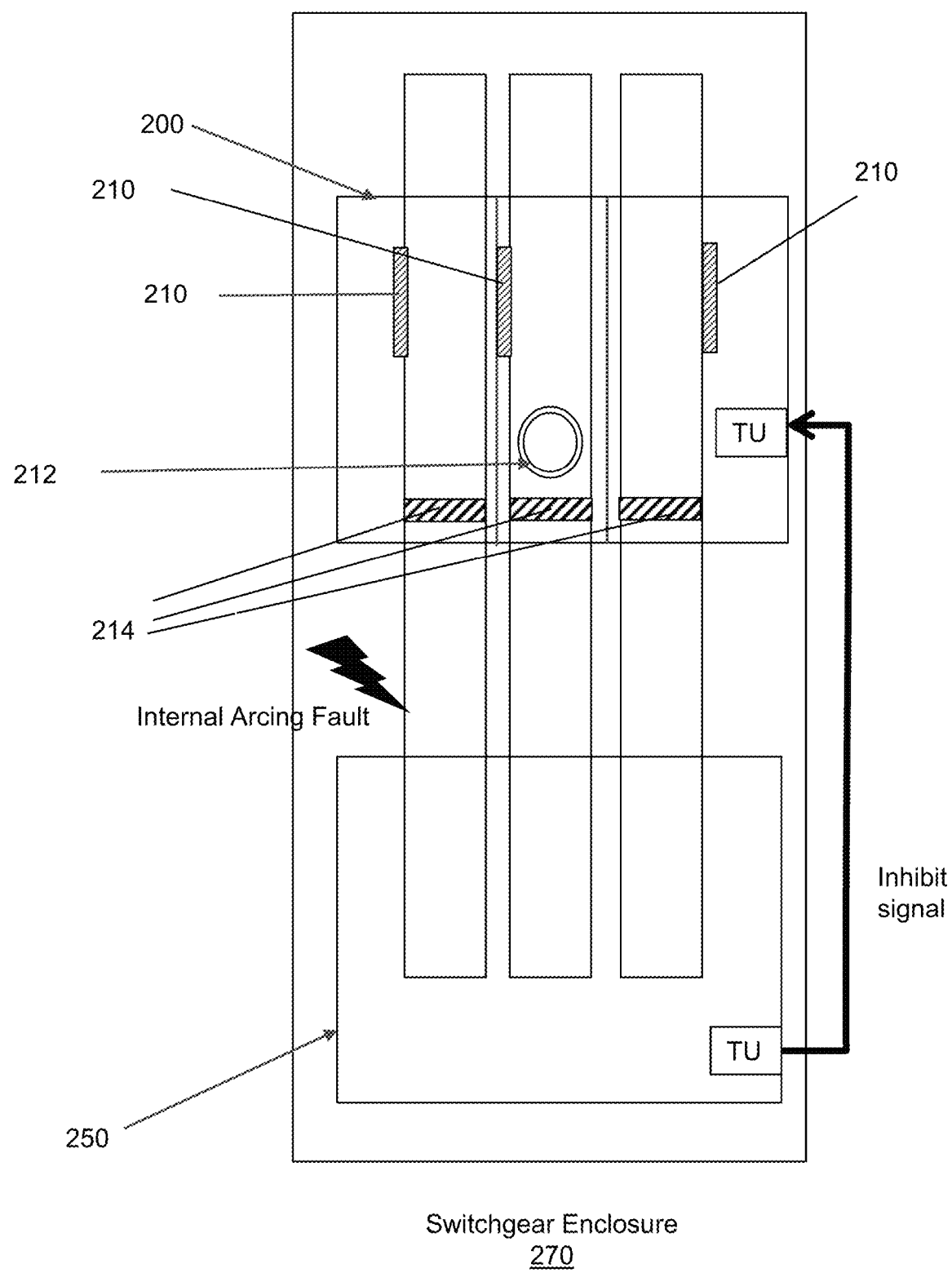
FIG. 2 is an example block diagram of a power distribution system with circuit protective device(s), such as circuit breakers, that employ RF sensors to implement a fast trip operation mode for detecting an arc fault and other conditions on a circuit to be protected, in accordance with an embodiment.

FIG. 2 is an example block diagram of a power distribution system with circuit protective device(s), such as circuit breakers 200 and 250, in which RF sensors are used to detect an arc fault and other conditions on a circuit to be protected in a fast trip operation mode, in accordance with a further embodiment. In this example, the power distribution system employs a three (3) phase power supply. The circuit breaker 200 is an upstream feeder breaker, and the circuit breaker 250 is a downstream and/or nearby branch circuit breaker. The circuit breakers 200 and 250 can be arranged or housed in a switchgear enclosure 270, and connected by conductive bus/line system for the 3-phase power supply. The circuit breaker 200 can be an air circuit breaker (ACB), which may be used for low voltage (LV) or other applications.

The circuit breaker 200 can include an electronic trip unit(s) or TUs and a plurality of sensors such as near-field RF sensor(s) 210, far-field RF sensor(s) 212 and current sensor(s) 214. In this example, a near-field RF sensor 210 is provided for each pole of the circuit breaker 200; and a current sensor 214 is provided for each pole of the circuit breaker 200. Each near-field RF sensor 210 is arranged or installed near or proximate a breaker contact(s) of a respective breaker pole (e.g., pole, phase, etc.) to sense RF signal(s) at or around the breaker contact(s). The far-field RF sensor 212 are arranged or installed away from the breaker contacts to sense RF signal(s) away from the circuit breaker or its contacts. In this example, each current sensor 214 is configured to sense current on a respective phase line on the protected circuit, and can also be configured to sense the rate of change of the current over time (di/dt) on a respective phase line of the protected circuit.

The trip unit(s) of the circuit breaker 200 can include among other things a processor(s) to perform a fast trip operation mode, such as described herein, and memory. The processor can be configured to detect an arc fault when (1) the far-field sensor 212 detects a high initial RF pulse (or burst) and sustained low level RF signal(s) in the far-field, (2) the near-field RF sensor(s) 210 is not detecting RF signals in the near-field, and (3) the rate of change of the current over time (di/dt) satisfies or exceeds a trip threshold for the current rate. In response to arc fault detection, the trip unit can cause a breaker mechanism of the circuit breaker 200 to disconnect the three-phase power supply from the protected circuit (e.g., separate breaker contacts, etc.). In various embodiments, the trip unit can directly trigger the tripping operation, via a fast trip solenoid. Furthermore, in various embodiments, in response to one or more downstream circuit breakers (e.g., branch circuit breaker 250) tripping, the trip unit 120 can be configured to receive an inhibit signal from the branch circuit breaker 250 and can inhibit the fast trip operation mode. In such as case, the circuit breaker 200 can still implement or maintain normal or other tripping operation mode(s) according to preset trip curve(s).

Figure 3:
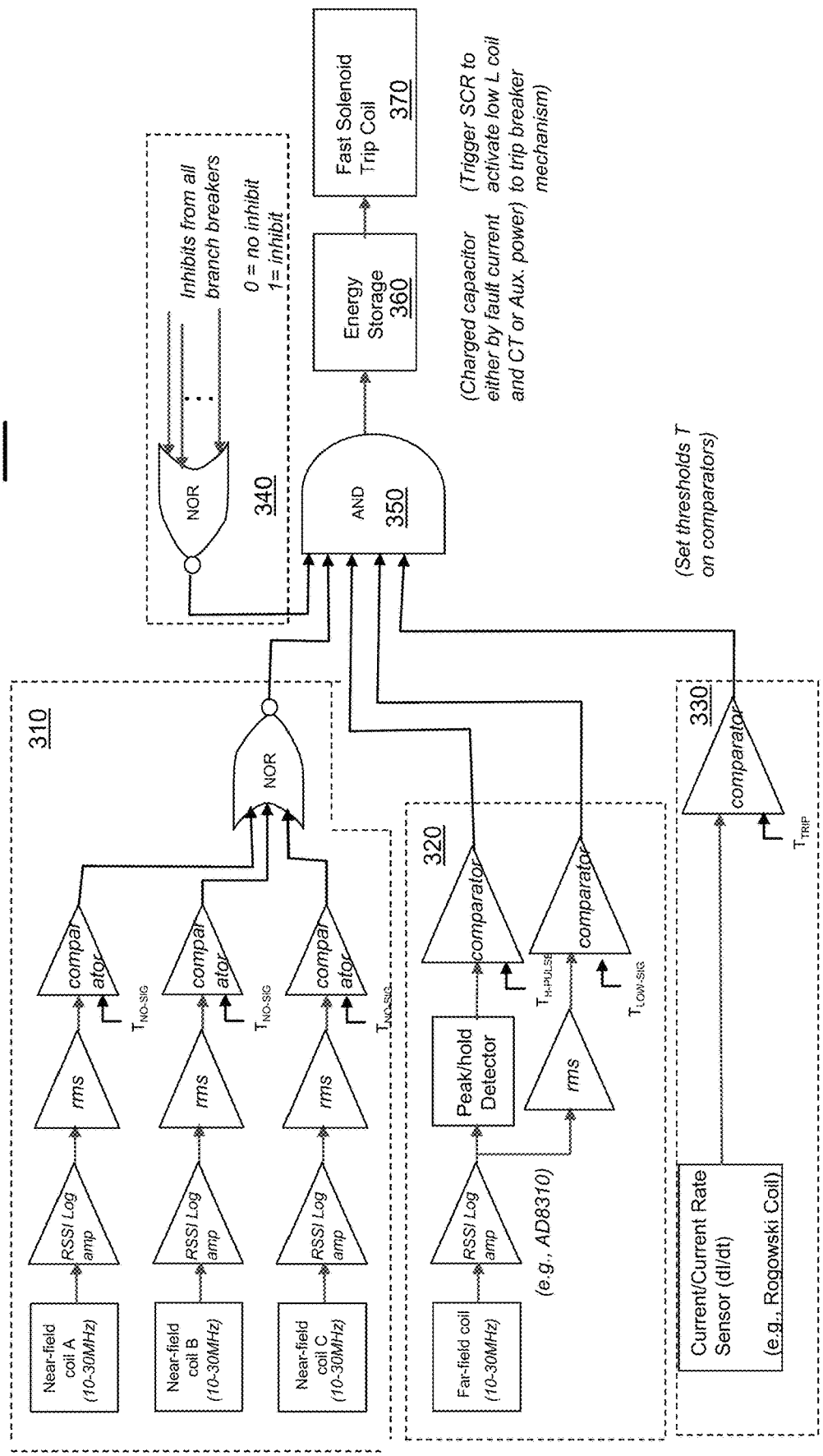
FIG. 3 illustrates an example block diagram of electronic detection logic for detecting an arc flash fault and other conditions on a circuit in a fast trip operation mode, in accordance with an embodiment.

FIG. 3 illustrates an example block diagram of electronic detection logic 300 for detecting an arc fault and other conditions on the circuit, in accordance with an embodiment. The electronic detection logic 300 may be implemented using one or more processors in a circuit breaker, which is configured to implement fast trip operation mode.

As shown in FIG. 3, the detection logic 300 can include near-field RF monitoring logic 310, far-field RF monitoring logic 320, current rate monitoring logic 330, mode inhibiting logic 340, and a AND gate 350 which receives the outputs from logics 310, 320, 330 and 340 and outputs a determination of whether an arc fault has been detected or not.

For example, near-field RF monitoring logic 310 is configured to output a determination of whether arcing (or arc flash) is occurring at or near the breaker contacts. In this example, RF signals are monitored at or near the breaker contacts for each phase line of a three-phase power system. For each line, RF signal(s) in a predefined RF range (e.g., 10-30 MHz) is detected via RF sensor (e.g., RF coil) tuned to the RF range, Received Signal Strength Indicator (RSSI) line amp and root-mean-square (rms) signal processing. For each line, the resulting RF signal(s) is compared at a comparator to a threshold (e.g., $T_{NO\text{-}SIGNAL}$, $V_{Sustained\ Threshold}$, etc.) to determine whether there are any RF signals. For example, if the magnitude of the resulting signal(s) is below the threshold, then no signal is detected on a line. The comparator output for each line is then provided to a NOR gate, which outputs TRUE or 1 for a determination of no signal when there are no near-field RF signals detected for each phase line from the comparators.

The far-field RF monitoring logic 320 is configured to provide two outputs. One output indicates whether a HIGH RF pulse (or burst) is detected from the far-field sensor(s), and the other output indicates whether a LOW sustained RF pulse is detected from the far-field sensor(s). To detect for HIGH RF pulse, RF signal(s) in a predefined RF range (e.g., 10-30 MHz) can be detected via a near-field RF sensor (e.g., RF coil) tuned to the RF range, and Received Signal Strength Indicator (RSSI) line amp. The detected RF signal is then held in a Peak/hold detector, and compared using a comparator to a high pulse threshold (e.g., $T_{H\text{-}PULSE}$, $V_{Burst\ Threshold}$, etc.) to determine whether a HIGH RF pulse has been detected. For example, if the detected RF signal satisfies or exceeds the high pulse threshold, a HIGH RF pulse has been detected. The comparator outputs TRUE or 1 when a HIGH RF pulse has been detected in the far-field, and FALSE or 0 otherwise.

Furthermore, to detect for LOW sustained RF signal(s) in the far-field, RF signal(s) in a predefined RF range (e.g., 10-30 MHz) can be detected via the far-field RF sensor (e.g., RF coil) tuned to the RF range, Received Signal Strength Indicator (RSSI) line amp and root-mean-square (rms) signal processing. The resulting RF signal(s) is compared at a comparator to a threshold (e.g., $T_{LOW\text{-}SIG}$, $V_{Sustained\ Threshold}$, etc.) to determine whether there is a sustained LOW level RF signal(s) in the far-field. For example, the magnitude of the resulting RF signal(s) is above the low-signal threshold but below the high-pulse threshold. The comparator outputs TRUE or 1 when a sustained LOW level RF signal(s) in the far-field has been detected, and FALSE or 0 otherwise.

The current rate monitoring logic 330 is configured to determine whether the rate of change of current over time on the protected circuit satisfies or exceeds a trip threshold ($T_{TRIP}$). The rate of change of the current can be monitored using a current sensor (e.g., CT, Rogowski coil, etc.), and compared to the trip threshold for a current rate using a comparator. The comparator outputs TRUE or 1 when rate of change of current over time on the protected circuit satisfies or exceeds the trip threshold for the current rate (e.g., $T_{TRIP}$), and FALSE or 0 otherwise.

The mode inhibiting logic 340 is configured to determine whether to inhibit fast trip operation mode (or tripping under this operational mode) using a NOR gate. In this example, the fast trip operation mode is inhibited in response to electrical activity from one or more downstream circuit breakers, such as the tripping of the downstream circuit breakers. The mode inhibiting logic 240 receives as inputs to the NOR gate signals from each downstream circuit breaker indicating whether the breaker has tripped or not. A tripped signal (also referred to as an inhibit signal) is represented as TRUE or 1, and a non-tripped signal is represented as FALSE or 0. The NOR gate outputs TRUE or 1 when none of branch circuit breakers have tripped, or FALSE or 0 when one or more of the branch circuit breakers have tripped.

The AND gate 350 receives the outputs from the near-field RF monitoring logic 310, far-field RF monitoring logic 320, current rate monitoring logic 330, and mode inhibiting logic 340. For example, in the fast trip operation mode, an arc fault can be detected when (1) a high initial RF pulse (or burst) and sustained low level RF signal(s) in the far-field, (2) no RF signal is detected in the near-field at or around the breaker contacts, (3) the rate of change of the current over time (di/dt) satisfies or exceeds a trip threshold for the current rate, and (4) no downstream circuit breakers have tripped. Thus, if the outputs are all TRUE or 1 from logics 310, 320, 330 and 340, the AND gate 350 outputs TRUE or 1 for detection of an arc fault.

In the response to arc fault detection output from the detection logic 300, a fast trip solenoid 370 is triggered using stored energy 360 to trip a breaker mechanism to disconnect a circuit from a power supply (e.g., trigger SCR to activate low L coil to trip breaker mechanism). The stored energy 360 can be provided through a capacitor charged either by a fault current via current transformer (CT) (e.g., current sensor circuitry) or auxiliary (Aux) power.

The detection electronic logic 300 is simply provided as one example of circuit logic for detecting an arc fault. The circuit logic can be configured in various ways to perform the arc fault detection, as described herein.

Figure 4:
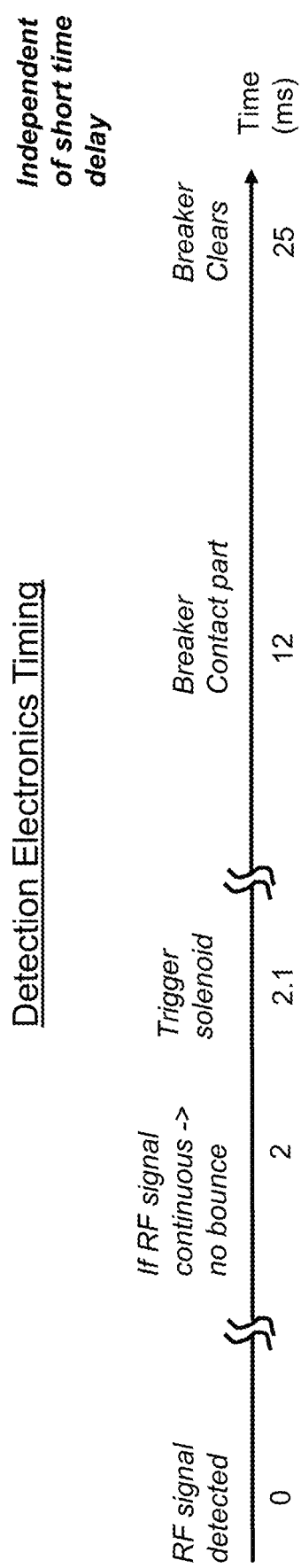
FIG. 4 illustrates an example diagram of a timing of operations associated with fault detection and tripping of a circuit breaker in a fast trip operation mode, in accordance with an embodiment.

FIG. 4 illustrates an example diagram of timing of a fast trip operation mode from initial RF signal sensing to breaker tripping and breaker clearing, in accordance with an embodiment. For the purposes of explanation, the timing is described with reference to general operational stages as described in FIG. 3. For example, as shown in FIG. 4, the RF signals are detected at time 0, an arc fault is detected around time 2.0 ms, the solenoid is triggered around time 2.1 ms, the breaker contacts part (or separate) around time 12.0 ms, and the breaker clears around time 25.0 ms. Accordingly, in the event of an arc fault, the fast trip operation mode using RF sensors can clear the circuit breaker significantly faster than some existing circuit breakers including those employing existing ERMS or ARMS functionality (e.g., clearing time around 30.0 ms), thereby significantly limiting incident energy from the arcing event.

Figure 5:
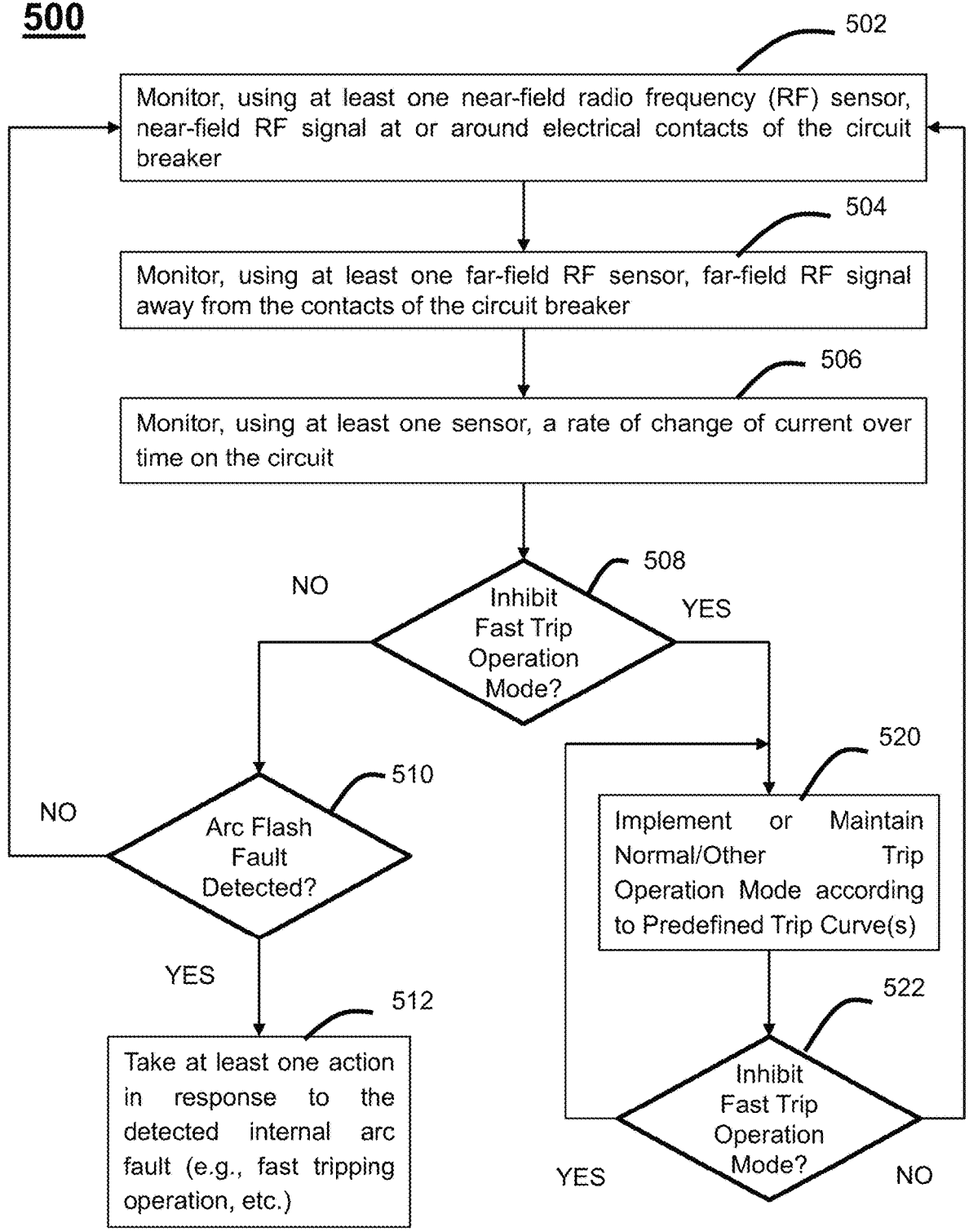
FIG. 5 is a flow chart illustrating example operations of a method by which an arc fault and other conditions on a circuit are detected in a fast trip operation mode, in accordance with an embodiment.

FIG. 5 is a flow chart illustrating example operations of a method 500 by which an arc fault and other conditions on a circuit are detected using a fast trip operation mode, in accordance with an embodiment. For the purposes of explanation, the method 500 will be described, for example, with reference to a circuit protective device such as an upstream circuit breaker and its components (e.g., a circuit breaker 100 in FIG. 1 and its processor(s), etc.).

The method 500 begins at block 502 in which at least one processor monitors, using at least one near-field RF sensor, near-field RF signal at or around electrical contacts of the circuit breaker.

At block 504, the at least one processor monitors, using at least one far-field RF sensor, far-field RF signal away from the contacts of the circuit breaker. The far-field RF signal may be monitored to detect any electrical activity away from the circuit breaker and its contacts (e.g., activities downstream from the circuit breaker or nearby the circuit breaker).

At block 506, the at least one processor monitors, using at least one sensor, a rate of change of current over time on the circuit. The sensor can be a current sensor, such as a CT or Rogowski coil.

At block 508, the at least one processor determines whether to inhibit the fast trip operation mode. For example, the at least one processor can inhibit the fast trip operation mode when one or more downstream circuit breakers have tripped. In various embodiments, each of the downstream circuit breakers (e.g., their tripping units) can transmit a signal (e.g., inhibit or not-inhibit signal) informing the at least one processor that it has tripped (or not). The at least one processor can then determine whether to inhibit (or not) the fast trip operation mode in response to the received signals from the downstream circuit breakers.

If the fast trip operation mode is not inhibited at block 508, the at least one processor can detect for an arc fault on the system using the fast trip operation mode at block 510. For example, as previously described herein, the at least one processor can detect an arc fault when (1) a high initial RF pulse (or burst) and sustained low level RF signal(s) in the far-field, (2) no RF signal is detected in the near-field at or around the breaker contacts, and (3) the rate of change of the current over time (di/dt) satisfies or exceeds a trip threshold for the current rate. If an arc fault is detected, then the at least one processor can take at least one action in response thereto at block 512. For example, the action can include performing a tripping operation of the circuit breaker, reporting the arc fault to a central monitoring system or personnel (and their computing devices), and so forth. The at least one processor can trip the breaker mechanism of the circuit breaker, via a fast trip solenoid. If no arc fault is detected at block 510, the method 500 returns back to block 502.

Turning back to block 508, if the fast trip operation mode is inhibited, the at least one processor can implement or maintain normal or other trip detection mode(s) according to preset trip curve(s) (including those discussed herein) at block 520. At block 522, the at least one processor can determine whether to inhibit the fast trip operation mode. If the fast trip operation mode is still inhibited, then the method 500 proceeds back to block 520. Otherwise, the method 500 proceeds to block 502.

Figure 6:
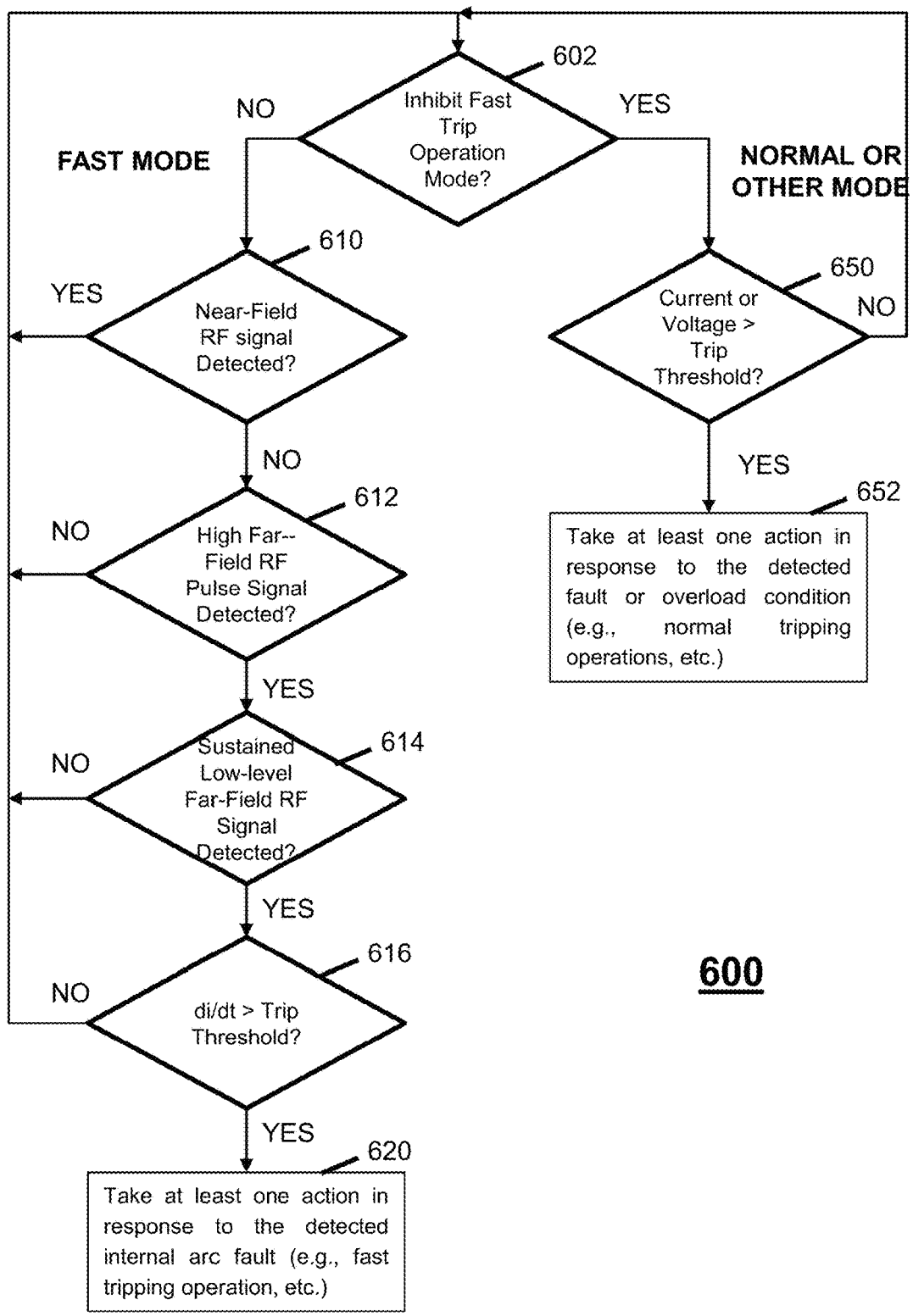
FIG. 6 is a flow chart illustrating example operations of a method by which an arc fault and other conditions on a circuit are detected in a fast trip operation mode, in accordance with an embodiment.

FIG. 6 is a flow chart illustrating example operations of a method 600 by which an arc fault and other conditions on a circuit are detected, in accordance with an embodiment. For the purposes of explanation, the method 600 will be described, for example, with reference to a circuit protective device such as an upstream circuit breaker and its components (e.g., a circuit breaker 100 in FIG. 1 and its processor(s), etc.).

The method 600 begins at block 602 in which the at least one processor determines whether to inhibit the fast trip operation mode. For example, the at least one processor can inhibit the fast trip operation mode when one or more downstream circuit breakers have tripped. In various embodiments, each of the downstream circuit breakers (e.g., their tripping units) can transmit a signal (e.g., inhibit signal or not-inhibit signal) informing the at least one processor that it has tripped (or not). The at least one processor can then determine whether to inhibit (or not) the fast trip operation mode in response to the received signals from the downstream circuit breakers.

If the fast trip operation mode is inhibited, then the at least one processor implements or maintains a normal or other trip operation mode according to preset trip curve(s). For example, the method 600 can proceed to block 650 in which the at least one processor determines whether current or voltage on the circuit satisfies or exceeds a trip threshold. If so, the at least one processor can take at least one action at block 652. The action can include performing a normal tripping operation of the circuit breaker according to the detected condition (e.g., overload, short-circuit, etc.). Otherwise, if the current or voltage does not satisfy or exceed the trip threshold for the voltage or current, the method 600 proceeds to block 602.

If the fast trip operation mode is not inhibited, the method 600 proceeds to block 610 in which the at least one processor determines whether any near-field RF signal(s) have been detected at or around the contacts of the circuit breaker, using near-field RF sensors. If near-field RF signal(s) is detected, the method 600 proceeds back to block 602. Otherwise, if no near-field RF signal(s) is detected, the at least one processor determines whether a High far-field RF pulse signal(s) away from the contacts of the circuit breaker has been detected at block 612.

At block 612, if no High far-field pulse signal is detected, the method 600 proceeds back to block 602. Otherwise, if a High far-field pulse signal is detected, the at least one processor determines whether a sustained Low-level far-field RF signal(s) is detected at block 614.

At block 614, if no sustained Low-level far-field RF signal(s) is detected, the method 600 proceeds back to block 602. Otherwise, if a sustained Low-level far-field RF signal(s) is detected, the at least one processor determines whether the rate of change of current over time (di/dt) on the circuit satisfies or exceeds a trip threshold for the current rate at block 616.

At block 616, if the rate of change of current over time (di/dt) on the circuit does not satisfy or exceed the trip threshold for the current rate, the method 600 proceeds back to block 602. Otherwise, if the rate of change of current over time on the circuit (di/dt) satisfies or exceeds the trip threshold for the current rate, the at least one processor detects an arc fault, and can take at least one action at block 620. For example, the action can include performing a fast tripping operation of the circuit breaker, reporting the arc fault to a central monitoring system or personnel (and their computing devices), and so forth. The at least one processor can trip the breaker mechanism of the circuit breaker, via a fast trip solenoid.

Figure 7:
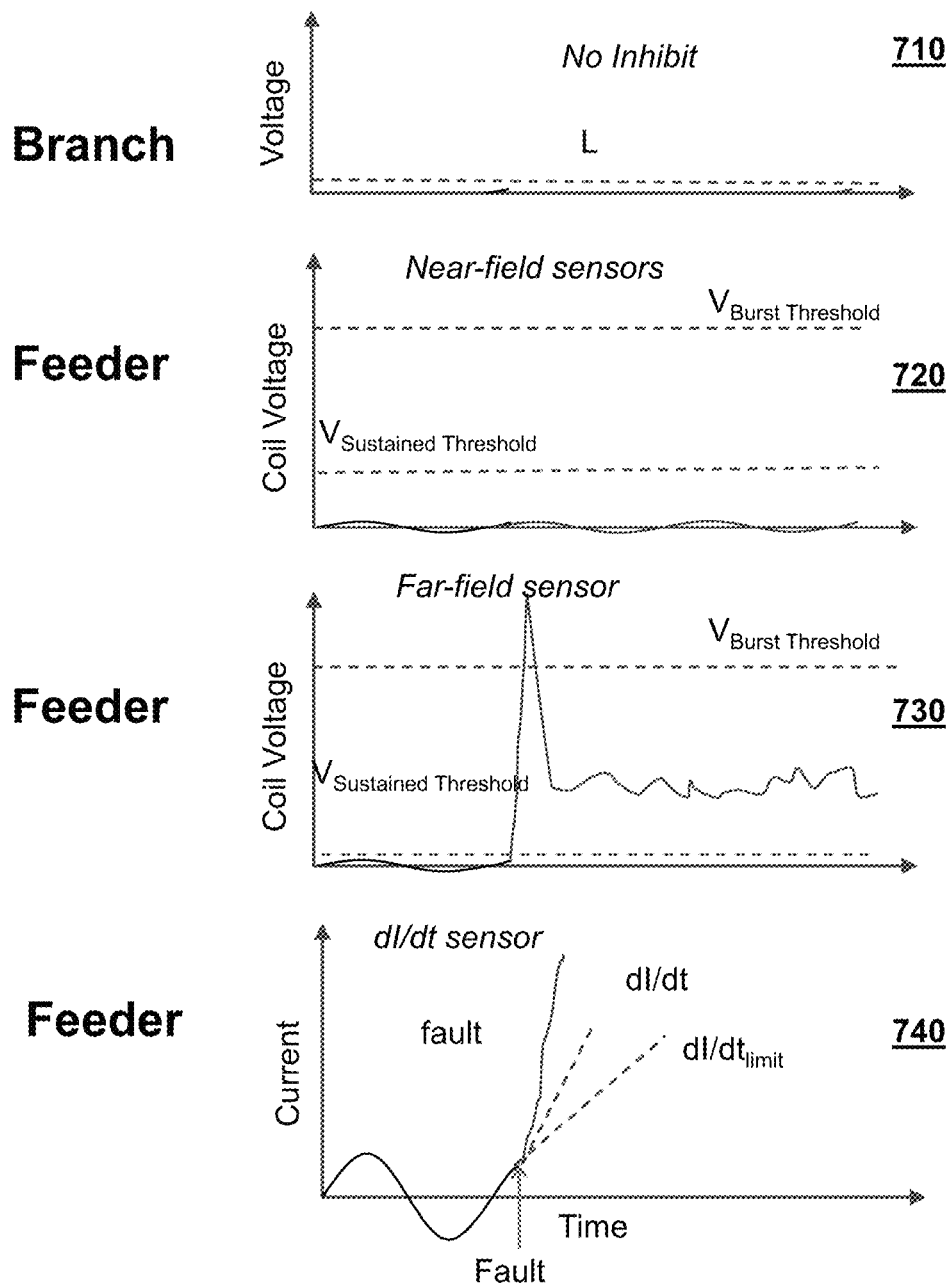
FIGS. 7-10 illustrate various example detection scenarios of different conditions on a circuit, which are detected using the fast trip operation mode, in accordance with an embodiment.

FIGS. 7-10 illustrate various example detection scenarios of different conditions on a protected circuit, which are detected using the fast trip operation mode, in accordance with various embodiments. For example, FIG. 7 illustrates an example Scenario #1 in which the fast trip operation mode detects an internal arc fault and, in response thereto, can trip the feeder circuit breaker (also referred to as "Feeder"). In this scenario, [A] there is no inhibit signal (e.g., a Low (L) signal) from the branch circuit breaker (also referred to as "Branch"), or in other words, the branch circuit breaker has not tripped (as shown by reference 710). Furthermore, at the feeder circuit breaker, [B] the near-field sensor(s) has not detected an RF signal (e.g., coil voltage from the RF sensor is below a threshold in this case $V_{Sustained\ Threshold}$) as shown by reference 720, [C] the far-field sensor(s) has detected a High RF pulse (e.g., coil voltage from the RF sensor passed through a threshold in this case $V_{Burst\ Threshold}$) as shown by reference 730, [D] the far-field sensor(s) also has detected a sustained Low-Level RF signal (e.g., coil voltage from the RF sensor is above $V_{Sustained\ Threshold}$ but below $V_{Burst\ Threshold}$ for a period of time) as shown by reference 730, and [E] the rate of change of current over time on the circuit (di/dt) satisfies or exceeds the trip threshold for the current rate (e.g., di/dt exceeds a threshold for the current rate) as shown by reference 740.

Figure 8:
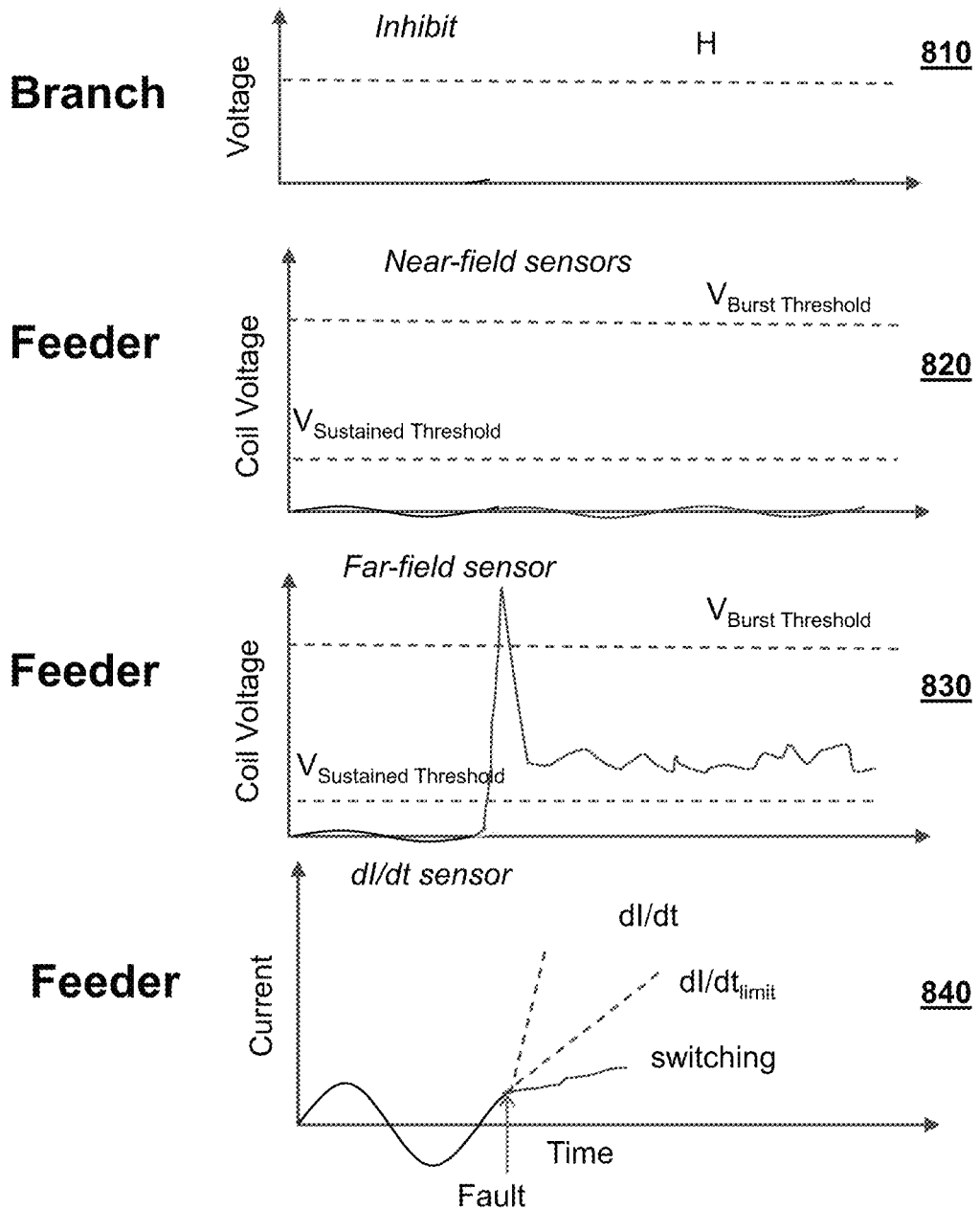

FIG. 8 illustrates an example Scenario #2 in which the fast trip operation mode detects a nearby circuit breaker switching and, in response thereto, does not trip the feeder circuit breaker. In this scenario, [A] there is an inhibit signal (e.g., High (H) signal) from the nearby branch circuit breaker (also referred to as "Branch"), or in other words, the branch circuit breaker is tripping or has tripped (as shown by reference 810). Furthermore, at the feeder circuit breaker, [B] the near-field sensor(s) has not detected an RF signal (e.g., coil voltage from the RF sensor is below a threshold in this case $V_{Sustained\ Threshold}$) as shown by reference 820, [C] the far-field sensor(s) has detected a High RF pulse (e.g., coil voltage from the RF sensor is above a threshold in this case $V_{Burst\ Threshold}$) as shown by reference 830, [D] the far-field sensor(s) also has detected a sustained Low-Level RF signal (e.g., coil voltage from the RF sensor passed through $V_{Burst\ Threshold}$ and above the $V_{Sustained\ Threshold}$ for a period of time) as shown by reference 830, and [E] the rate of change of current over time (di/dt) on the circuit does not satisfy or exceed the trip threshold for the current rate (e.g., di/dt is below a threshold for the current rate) as shown by reference 840.

Figure 9:
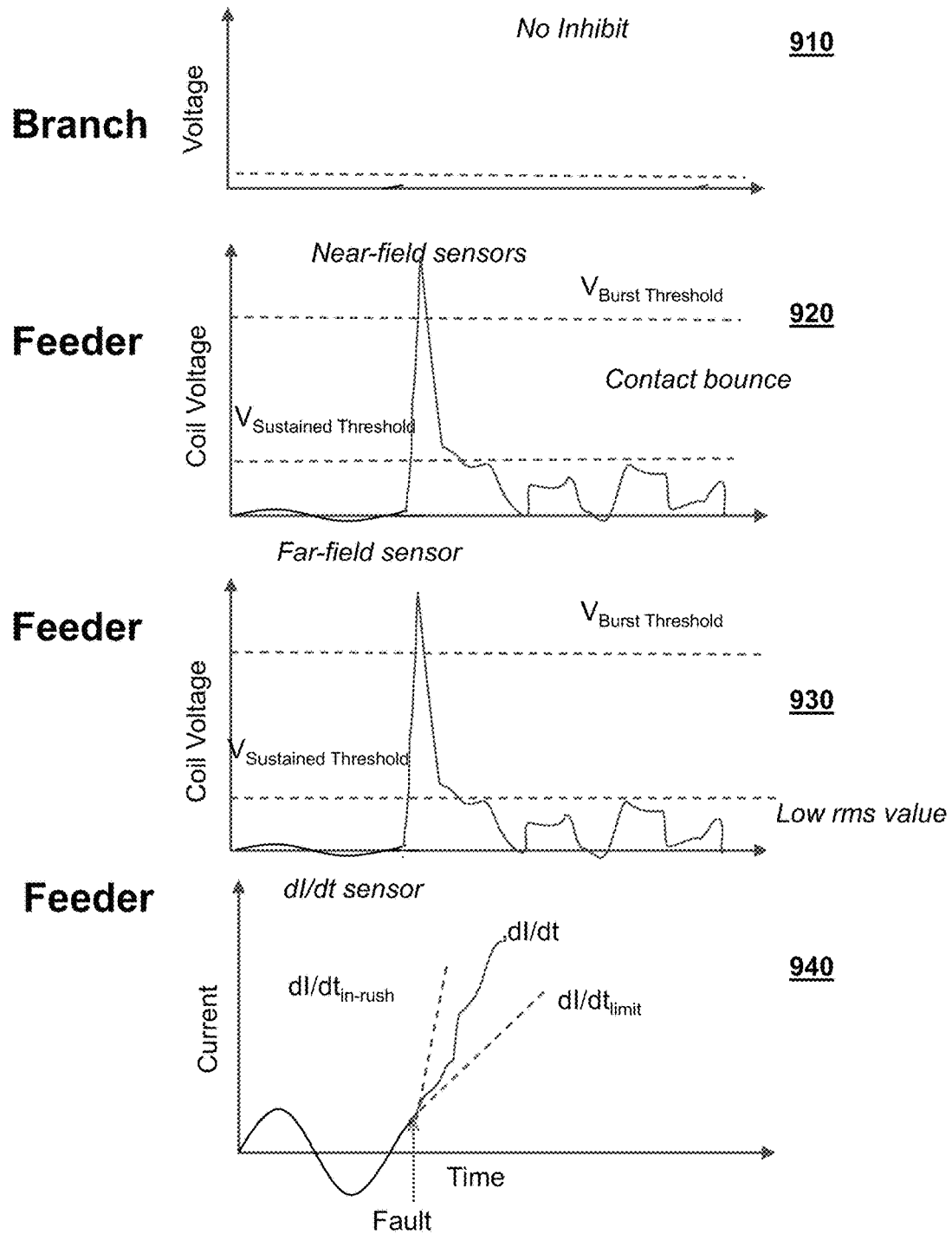

FIG. 9 illustrates an example Scenario #3 in which the fast trip operation mode detects the feeder circuit breaker closing on in-rush and, in response thereto, does not trip the feeder circuit breaker. In this scenario, [A] there is no inhibit signal (e.g., a Low (L) signal) from the branch circuit breaker (also referred to as "Branch"), or in other words, the branch circuit breaker has not tripped (as shown by reference 910). Furthermore, at the feeder circuit breaker, [B] the near-field sensor(s) has detected an RF signal (e.g., coil voltage from the RF sensor is above a threshold in this case $V_{Burst\ Threshold}$ and intermittently above $V_{Sustained\ Threshold}$ reflecting a High RF Pulse signal from contact bounce) as shown by reference 920, [C] the far-field sensor(s) has detected a High RF pulse (e.g., coil voltage from the RF sensor is above a threshold in this case $V_{Burst\ Threshold}$) as shown by reference 930, [D] the far-field sensor(s) also has not detected a sustained Low-Level RF signal (e.g., coil voltage from the RF sensor is above $V_{Burst\ Threshold}$ but below $V_{Sustained\ Threshold}$ for a period of time or has a low rms value) as shown by reference 930, and [E] the rate of change of current over time (di/dt) on the circuit satisfies or exceeds the trip threshold for the current rate (e.g., di/dt is above a threshold for the current rate) as shown by reference 940.

Figure 10:
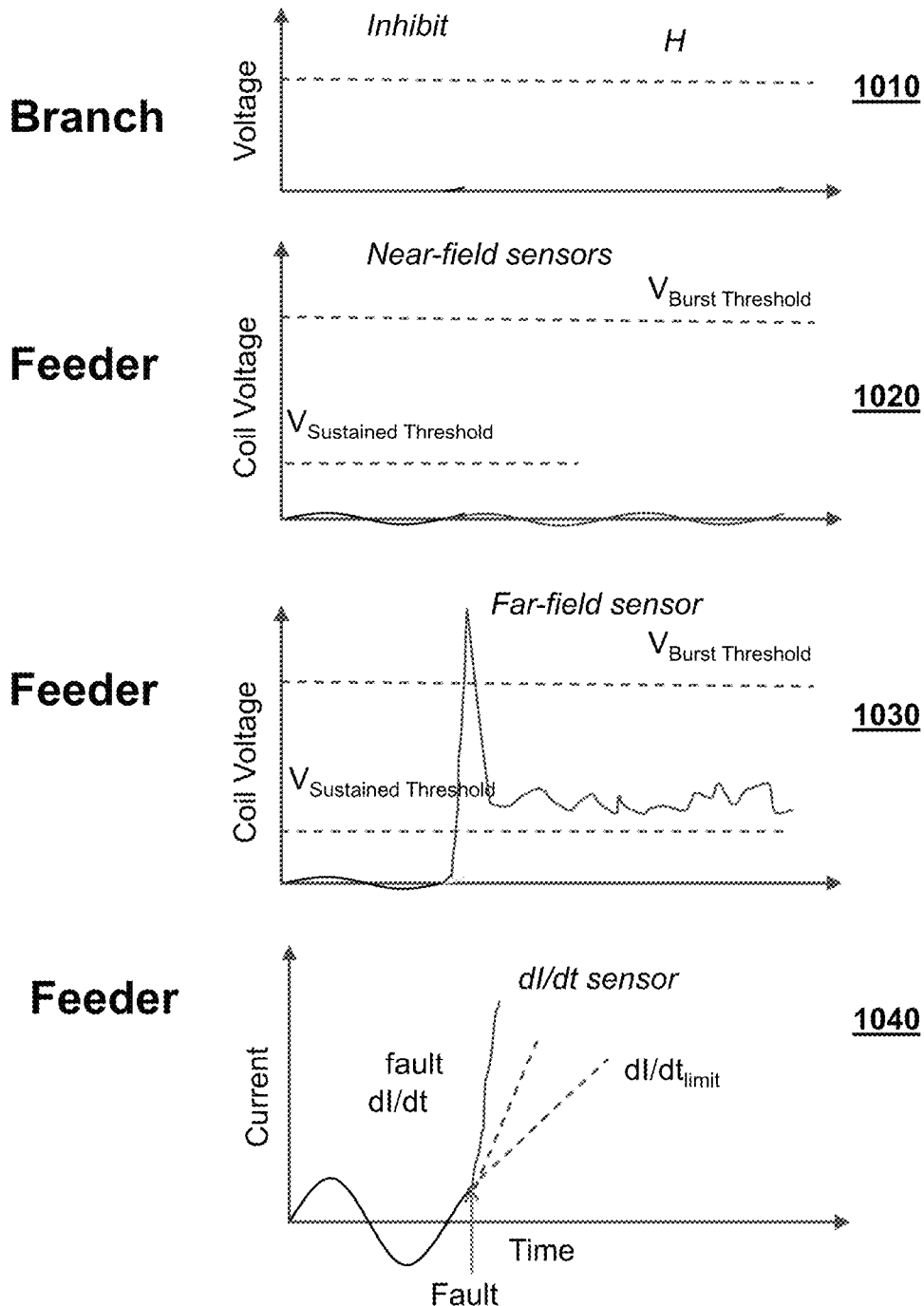

FIG. 10 illustrates an example Scenario #4 in which the fast trip operation mode detects a nearby circuit breaker opening and, in response thereto, does not trip the feeder circuit breaker. In this scenario, [A] there is an inhibit signal (e.g., High (H) signal) from the nearby branch circuit breaker (also referred to as "Branch"), or in other words, the branch circuit breaker is tripping or has tripped (as shown by reference 1010). Furthermore, at the feeder circuit breaker, [B] the near-field sensor(s) has not detected an RF signal (e.g., coil voltage from the RF sensor is below a threshold in this case $V_{Sustained\ Threshold}$) as shown by reference 1020, [C] the far-field sensor(s) has detected a High RF pulse (e.g., coil voltage from the RF sensor is above a threshold in this case $V_{Burst\ Threshold}$) as shown by reference 1030, [D] the far-field sensor(s) also has detected a sustained Low-Level RF signal (e.g., coil voltage from the RF sensor is above $V_{Burst\ Threshold}$ and above $V_{Sustained\ Threshold}$ for a period of time) as shown by reference 1030, and [E] the rate of change of current over time (di/dt) on the circuit satisfies or exceeds the trip threshold for the current rate (e.g., di/dt is above a threshold for the current rate) as shown by reference 1040.

In the preceding, reference is made to various embodiments. However, the scope of the present disclosure is not limited to the specific described embodiments. Instead, any combination of the described features and elements, whether related to different embodiments or not, is contemplated to implement and practice contemplated embodiments.

Furthermore, although embodiments may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

The various embodiments disclosed herein may be implemented as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer-readable medium(s) having computer-readable program code embodied thereon.

Any combination of one or more computer-readable medium(s) may be utilized. The computer-readable medium may be a non-transitory computer-readable medium. A non-transitory computer-readable medium may be, for example, but not limited to, an electronic, magnetic, optical, electromagnetic, infrared, or semiconductor system, apparatus, or device, or any suitable combination of the foregoing. More specific examples (a non-exhaustive list) of the non-transitory computer-readable medium can include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages. Moreover, such computer program code can execute using a single computer system or by multiple computer systems communicating with one another (e.g., using a local area network (LAN), wide area network (WAN), the Internet, etc.). While various features in the preceding are described with reference to flowchart illustrations and/or block diagrams, a person of ordinary skill in the art will understand that each block of the flowchart illustrations and/or block diagrams, as well as combinations of blocks in the flowchart illustrations and/or block diagrams, can be implemented by computer logic (e.g., computer program instructions, hardware logic, a combination of the two, etc.). Generally, computer program instructions may be provided to a processor(s) of a general-purpose computer, special-purpose computer, or other programmable data processing apparatus. Moreover, the execution of such computer program instructions using the processor(s) produces a machine that can carry out a function(s) or act(s) specified in the flowchart and/or block diagram block or blocks.

The flowchart and block diagrams in the Figures illustrate the architecture, functionality and/or operation of possible implementations of various embodiments of the present disclosure. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the above description is intended to be illustrative, and not restrictive. Many other implementation examples are apparent upon reading and understanding the above description. Although the disclosure describes specific examples, it is recognized that the systems and methods of the disclosure are not limited to the examples described herein, but may be practiced with modifications within the scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

We claim:

1. A method of controlling operations of a circuit breaker for connecting or disconnecting a power supply to or from a circuit respectively, the method comprising:
    monitoring, using at least one near-field radio frequency (RF) sensor of the circuit breaker, near-field RF signal at or around electrical contacts of the circuit breaker;
    monitoring, using at least one far-field RF sensor of the circuit breaker, far-field RF signal away from the contacts of the circuit breaker;
    monitoring, using at least one sensor of the circuit breaker, a rate of change of current over time on the circuit;
    detecting an arc fault on the circuit based on the monitored near-field RF signal, the monitored far-field RF signal, and the monitored rate of change of current; and
    implementing a tripping operation on the circuit breaker to disconnect the power supply from the circuit, in response to the detection of the arc fault.

2. The method according to claim 1, wherein the at least one near-field sensor comprises a near-field RF sensor for each pole of the circuit breaker which comprises a multi-pole circuit breaker or a circuit breaker for a multi-phase power supply.

3. The method according to claim 1, wherein the controlling initiates a tripping operation in response to (1) detection of high initial RF signal pulse and a sustained low level RF signal via the far-field RF sensor, (2) no detection of an RF signal via the near-field RF sensor, and (3) detection of the rate of change of current over time satisfying or exceeding a trip threshold.

4. The method according to claim 1, wherein the circuit breaker comprises an upstream circuit breaker, and the circuit comprises at least one branch circuit having a branch circuit breaker which is downstream from the upstream circuit breaker, the method further comprising:
    receiving information that the at least one branch circuit breaker is tripping or switching; and
    inhibiting the tripping operation of the upstream circuit breaker in response to the received information.

5. The method according to claim 1, wherein the circuit breaker comprises an upstream or feeder circuit breaker, and the circuit comprises a plurality of branch circuits each of which has a branch circuit breaker which is downstream from the upstream or feeder circuit breaker, the method further comprising:
    receiving information that one or more of the plurality of branch circuit breakers are tripping or switching; and
    inhibiting the tripping operation of the upstream or feeder circuit breaker in response to the received information.

6. The method according to claim 1, wherein the near-field and far-field RF sensors are tuned for a frequency range comprising at or around 10 to 30 MHz bandwidth.

7. The method according to claim 1, wherein the monitored near-field and far-field RF signals are used to monitor electrical conditions on the circuit within a switchgear enclosure.

8. The method according to claim 1, wherein the implementing implements the tripping operation, which comprises a fast trip operation of the circuit breaker, by directly tripping a breaker mechanism of the circuit breaker, via a fast trip solenoid, in response to detection of the arc fault.

9. The method according to claim 8, further comprising:
    receiving an inhibit signal from at least one downstream or nearby circuit breaker indicating that the downstream circuit breaker is tripping or switching; and
    inhibiting the fast trip operation of the circuit breaker while enabling the circuit breaker to operate in a normal trip operation mode according to at least one predefined trip curve.

10. A circuit breaker for connecting or disconnecting a power supply to or from a circuit respectively, comprising:
    at least one near-field radio frequency (RF) sensor for monitoring near-field RF signal at or around electrical contacts of the circuit breaker;
    at least one far-field radio frequency (RF) sensor for monitoring far-field RF signal away from the contacts of the circuit breaker;
    at least one sensor for monitoring a rate of change of current over time on the circuit;
    at least one processor configured:
        to detect an arc fault on the circuit based on the monitored near-field RF signal, the monitored far-field RF signal, and the monitored rate of change of current; and
        to initiate implementation of a tripping operation to disconnect the power supply from the circuit, in response to the detection of the arc fault.

11. The circuit breaker according to claim 10, wherein the at least one near-field sensor comprises a near-field RF sensor for each pole of the circuit breaker which comprises a multi-pole circuit breaker or a circuit breaker for a multi-phase power supply.

12. The circuit breaker according to claim 1, wherein the at least one processor initiates implementation of a tripping operation in response to (1) detection of high initial RF signal pulse and a sustained low level RF signal via the far-field RF sensor, (2) no detection of an RF signal via the near-field RF sensor, and (3) detection of the rate of change of current over time satisfying or exceeding a trip threshold.

13. The circuit breaker according to claim 10, wherein the circuit breaker comprises an upstream circuit breaker, and the circuit comprises at least one branch circuit having a branch circuit breaker which is downstream from the upstream circuit breaker, the at least one processor being further configured:
- to receive information that the at least one branch circuit breaker is tripping or switching; and
- to inhibit the tripping operation of the upstream circuit breaker in response to the received information.

14. The circuit breaker according to claim 10, wherein the circuit breaker comprises an upstream or feeder circuit breaker, and the circuit comprises a plurality of branch circuits each of which has a branch circuit breaker which is downstream from the upstream or feeder circuit breaker, the at least one processor being further configured:
- to receive information that one or more of the plurality of branch circuit breakers are tripping or switching; and
- to inhibit the tripping operation of the upstream or feeder circuit breaker in response to the received information.

15. The circuit breaker according to claim 10, wherein the near-field and far-field RF sensors are tuned for a frequency range comprising at or around 10 to 30 MHz bandwidth.

16. The circuit breaker according to claim 10, wherein the monitored near-field and far-field RF signals are used to monitor electrical conditions on the circuit within a switchgear enclosure.

17. The circuit breaker according to claim 10, wherein the at least one processor is configured to implement the tripping operation, which comprises a fast trip operation of the circuit breaker, by directly tripping a breaker mechanism of the circuit breaker, via a fast trip solenoid, in response to detection of the arc fault.

18. The circuit breaker according to claim 17, wherein the at least one processor is further configured:
- to receive an inhibit signal from at least one downstream or nearby circuit breaker indicating that the downstream circuit breaker is tripping or switching; and
- to inhibit the fast trip operation of the circuit breaker while enabling the circuit breaker to operate in a normal trip operation mode according to at least one predefined trip curve.

19. A non-tangible computer readable medium storing computer code, which when executed by at least one processor, implements a process of controlling operations of a circuit breaker, the process comprising:
- monitoring, using at least one near-field radio frequency (RF) sensor of the circuit breaker, near-field RF signal at or around electrical contacts of the circuit breaker;
- monitoring, using at least one far-field RF sensor of the circuit breaker, far-field RF signal away from the contacts of the circuit breaker;
- monitoring, using at least one sensor of the circuit breaker, a rate of change of current over time on the circuit;
- detecting an arc fault on a circuit based on the monitored near-field RF signal, the monitored far-field RF signal, and the monitored rate of change of current; and
- implementing a tripping operation on the circuit breaker to disconnect a power supply from the circuit, in response to the detection of the arc fault.

* * * * *